(12) United States Patent
Fjelstad et al.

(10) Patent No.: US 6,218,213 B1
(45) Date of Patent: Apr. 17, 2001

(54) MICROELECTRONIC COMPONENTS WITH FRANGIBLE LEAD SECTIONS

(75) Inventors: Joseph Fjelstad, Sunnyvale; John W. Smith, Palo Alto, both of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/325,262

(22) Filed: Jun. 3, 1999

Related U.S. Application Data

(60) Provisional application No. 60/087,801, filed on Jun. 3, 1998.

(51) Int. Cl.[7] ............................ H01L 21/44; H01L 21/48; H01L 21/50
(52) U.S. Cl. ............................ 438/106; 438/126; 438/127
(58) Field of Search .................................. 438/106, 126, 438/127

(56) References Cited

U.S. PATENT DOCUMENTS

| | | | |
|---|---|---|---|
| 5,148,265 | 9/1992 | Khandros et al. | 357/80 |
| 5,148,266 | 9/1992 | Khandros et al. | 357/80 |
| 5,398,863 | 3/1995 | Grube et al. | 228/106 |
| 5,489,749 | 2/1996 | Distefano et al. | 174/261 |
| 5,491,302 | 2/1996 | Distefano et al. | 114/260 |
| 5,518,964 | 5/1996 | Distefano et al. | 437/209 |
| 5,629,239 | 5/1997 | Distefano et al. | 216/14 |

FOREIGN PATENT DOCUMENTS

WO 94/03036    2/1994    (WO).

*Primary Examiner*—Richard Booth
*Assistant Examiner*—Josetta Jones
(74) *Attorney, Agent, or Firm*—Lerner, David, Littenberg, Krumholz & Mentlik, LLP

(57) ABSTRACT

Flexible leads for making electrical connection in microelectronic components include a frangible intermediate section. The frangible intermediate section is formed by a region within the lead having weakened mechanical integrity. The frangible intermediate section is made by providing a sacrificial metal layer and forming a projection on the surface of the metal layer from a portion thereof. Lead forming material is deposited onto the surface of the sacrificial metal layer and over the projection. A dielectric layer is formed on the surface of the lead forming material. Upon removing the sacrificial metal layer, a frangible intermediate section is formed within the lead forming material at the location of the projection.

40 Claims, 4 Drawing Sheets

MICROELECTRONIC COMPONENTS WITH FRANGIBLE LEAD SECTIONS

The present invention claims the benefit of the U.S. Provisional Application No. 60/087,801 filed on Jun. 3, 1998, the disclosure of which is incorporated by reference herein.

FIELD OF THE INVENTION

The present invention relates in general to microelectronic components such as semiconductor chip assemblies, and more particularly, to frangible leads for use in such microelectronic components, as well as methods of manufacturing same.

BACKGROUND OF THE INVENTION

Semiconductor chips typically are connected to external circuitry through contacts on the surface of the chip. The contacts may be disposed in a grid on the front surface of the chip or in elongated rows extending along the edges of the chip's front surface. Each such contact must be connected to an external circuit element such as a circuit trace on a supporting substrate or circuit panel. In the conventional wire bonding process, the back surface of the chip is physically mounted on the substrate. A bonding tool bearing a fine wire is engaged with an individual contact on the face surface of the chip so as to bond the wire to the contact. The tool is then moved to a contact pad of the circuit on the substrate, while dispensing wire through the tool, until the tool engages the contact pad on the substrate and the wire is bonded thereto. This process is repeated for each contact.

In a tape automated bonding or process, a dielectric supporting tape is provided with a hole slightly larger than the chip. Metallic leads are provided on the dielectric tape are cantilevered into the hole in the tape. An inner end of each lead projects inwardly beyond the edge of the hole. These plural leads are arranged side-by-side in rows. Each row of contacts on the chip is aligned with one such row of leads. The inner ends of the leads are bonded to the contacts of the chip by ultrasonic or thermocompression bonding. The outer ends of the leads are connected to the external circuitry. U.S. patent application Ser. No. 08/560,272 entitled "A Structure and Method For Making a Compliant Lead For a Microelectronic Device" filed on Nov. 11, 1995, which application is assigned to the same assignee of the present application, is hereby incorporated by reference herein. The '272 Application discloses leads having a recrystallized surface layer thereby creating a fine grain, dense surface layer of lead material.

The rapid evolution of the semiconductor art has created continued demand for incorporation of progressively greater numbers of contacts and leads in a given amount of space. U.S. Pat. No. 5,489,749, the disclosure of which is incorporated by reference herein, offers one solution. As disclosed in certain embodiments of the patent, a semiconductor chip connection component may include a plurality of electrically conductive leads and may also include a support structure such as a flexible, dielectric film with a compliant, typically elastomeric underlayer disposed beneath the flexible film. Each such lead desirably is connected to a terminal disposed on the surface of the support structure. A connection section of each lead extends across a gap in the support structure. A first end of each connection section, connected to one of the terminals, is permanently attached to the support structure, whereas the opposite second end of the connection section is releasably attached to the support structure. For example, the second end of each connection section may be connected through a frangible section connecting the second end to a bus structure anchored on the support structure.

In certain processes described in the '749 Patent, the connection component is juxtaposed with the chip so that the support structure, and preferably to a compliant layer thereof, overlies the contact-bearing surface of the chip and so that the gap or slot in the support structure is aligned with a row of contacts on the chip. This process serves to align each connection section with a contact on the chip. After placement of the connection component on the chip, each lead is engaged by a bonding tool. The bonding tool moves downwardly towards the surface of the chip. As the bonding tool moves downwardly, it disengages the second end of each lead connection section from the support structure, as by breaking the frangible section of the lead, and moves the connection section downwardly into engagement with the chip contact. At the same time, guide surfaces on the bottom of the bonding tool engage the connection section and guide it into more precise alignment with the associated contact. The bonding tool then bonds the connection section to the contact.

The end-supported lead bonding processes according to the '749 Patent offer numerous advantages. Because each lead is supported at both ends prior to bonding, it can be maintained in position until it is captured by the bonding tool. The bonding tool will reliably capture the correct lead, and hence there is little chance that an incorrect lead will be bonded to a contact. Moreover, the products resulting from the disclosed processes allow free movement of the terminals on the support structure relative to the chip after connection, both in the X and Y directions, parallel to the chip surface, and in the Z or compliance direction perpendicular to the chip surface. Thus, the assembly can be readily tested by engaging a multiple probe test fixture with the terminals. When the terminals on the support structure are bonded to contact pads of a substrate, as by solder bonding or other processes, the assembly can compensate for differential thermal expansion between the chip and the substrate, as by flexing of the leads and deformation of the flexible support structure.

Certain components and processes disclosed in the '749 Patent can be used to fabricate semiconductor chip assemblies with closely spaced leads. Merely by way of example, rows of connection sections may be provided side-by-side at center-to-center spacing of about 100 micrometers or less, and may be successfully bonded to the contacts of the chip. Additional improvements in the bonding structures and techniques as set forth in the commonly assigned U.S. Pat. Nos. 5,398,863 and 5,491,302, the disclosures of which are hereby incorporated by reference herein, still further facilitate bonding of closely spaced leads and formation of reliable assemblies even where the leads are extremely small, using the basic techniques set forth in the '749 Patent.

However, manufacture of the preferred connection components for use in these processes has heretofore required precise control of photoforming processes. The leads utilized in certain end-supported lead bonding processes have incorporated connection sections of substantially uniform widths and frangible sections having widths less than the width of the connection section. For example, the frangible section may be defined by a pair of V-shaped notches extending inwardly towards one another in the widthwise direction from laterally opposite edges of the connection section. The width between the points of the V is substantially less than the width of the remaining portion of the connection section. Although this arrangement provides useful frangible sections, it imposes stringent requirements on the photoforming process. The process must be capable of forming feature sizes as small as the smallest width within the frangible section. Stated another way, the photoforming process must be more precise than required to form the connection sections themselves.

Bonding structures and techniques which overcome the limitations imposed by the photoforming process are disclosed in commonly assigned U.S. Pat. No. 5,629,239, the disclosure of which is hereby incorporated by reference. According to the '239 Patent, a plurality of leads, each extending over a gap in a support structure, include lead-forming material in an elongated strip-like lead region extending in a lead direction. Frangible sections in the leads are formed by applying a weakening treatment to the lead-forming material throughout an elongated treatment zone extending across a plurality of the lead regions transverse to the lead direction. The weakening treatment is applied without regard to the edge boundaries of the leads.

The weakening treatment may be applied after formation of the individual leads. Where the leads are formed in an additive plating process, the lead material may be deposited in the strip-like lead regions, and subsequently exposed to the weakening treatment. The weakening treatment may include exposure to radiant energy such as a laser beam to ablate the lead-forming material, chemical etchants or alloying agents, or mechanical deformation by a tool. These treatments can be applied after formation of the leads throughout the treatment zone. For example, radiant energy or chemical agents can be applied using a mask having an elongated slot defining the treatment zone extending across plural lead regions. There is no need to control the extent of the weakening treatment precisely in the width-wise direction of the leads, transverse to the leads themselves. The process used to form the leads need not provide features any finer than the width of the individual lead connection sections themselves. Stated another way, the width of each lead connection section can be as fine as the finest feature size permitted by the photoforming process.

As further disclosed in the '239 Patent, the frangible sections may be formed directly in the leads. In this regard, a dielectric layer may be provided with an elongated ridge extending along the treatment zone where the frangible sections are to be formed in the leads. In accordance with this arrangement, the leads are formed by plating lead-forming material over the surface of the dielectric layer and elongated ridge using a suitable mask. The elongated ridge tends to promote formation of a thin section in the plated lead-forming material at the intersection of each lead region with the ridge, thereby providing a frangible section of reduced thickness.

There has been a desire heretofore for continuously improving methods of making connection components useful in end-supported lead bonding and for improved connection components incorporating frangible leads.

SUMMARY OF THE INVENTION

The present invention provides leads having a frangible intermediate section which are useful in microelectronic components such as semiconductor chips, wafers, connection components, interposers and any other electrical assembly incorporating conductive elements which are useful in mounting and connecting electronic devices. The leads have a frangible intermediate section by virtue of the method of manufacturing same in accordance with the present invention. Specifically in accordance with one embodiment of the present invention, the leads are formed by providing a sacrificial metal layer, for example, aluminum, having a projection formed from the material of the sacrificial metal layer. Lead forming material such as copper, gold, gold copper alloys and the like is deposited over the surface of the sacrificial metal layer and the projection. A dielectric layer is provided on the surface of the lead forming material. Subsequently, the sacrificial metal layer is removed whereby a frangible intermediate section is formed within the lead forming material at the location of the projection.

In accordance with another embodiment of the present invention there is described a method of making a microelectronic component comprising the steps of providing at least one lead extending over a gap extending through a vertical extent of a support structure, each lead including a first connection section extending from the support structure on one side of the gap, a second connection section extending from the support structure on the other side of the gap, and a frangible intermediate section joining the connection sections, the lead formed by providing a sacrificial metal layer, forming a projection on the surface of the sacrificial metal layer from a portion thereof, depositing lead forming material onto the surface of the sacrificial metal layer and over the projection, forming a dielectric layer on the surface of the lead forming material, and removing the sacrificial metal layer whereby the frangible intermediate section is formed within the lead forming material at the location of the projection, the frangible intermediate section and at least a part of the first connection section aligned over the gap so that the first connection section of each lead can be detached from the second connection section by breaking the frangible intermediate section upon being displaced in the gap.

In accordance with another embodiment of the present invention there is described a method of making electrical connection to a microelectronic component having at least one contact, the method comprising juxtaposing a connection component with a microelectronic component, the connection component having a supporting structure and at least one lead made in accordance with the aforesaid method connected to the supporting structure, the lead including a bond region adjacent the frangible intermediate section adapted to be aligned with the contact, severing the lead at the frangible intermediate section, and bonding the bond region of the lead to the contact on the microelectronic component.

In accordance with another embodiment of the present invention there is described a method of making a microelectronic assembly comprising electrically connecting a microelectronic component to another microelectronic component, at least one of the microelectronic components made in accordance with the aforesaid method.

In accordance with another embodiment of the present invention there is described a lead having a frangible intermediate section for connecting microelectronic elements together, the lead made in accordance with the aforesaid method.

In accordance with another embodiment of the present invention there is described a microelectronic component made in accordance with the aforesaid method.

In accordance with another embodiment of the present invention there is described a microelectronic assembly made in accordance with the aforesaid method.

BRIEF DESCRIPTION OF THE DRAWINGS

The above description, as well as further objects, features and advantages of the present invention will be more fully understood with reference to the following detailed description of microelectronic components with frangible lead sections, when taken in conjunction with the accompanying drawings, wherein.

DETAILED DESCRIPTION OF THE PREFERRED EMBODIMENTS

In describing the preferred embodiments of the subject matter illustrated and to be described with respect to the drawings, specific terminology will be resorted to for the sake of clarity. However, the invention is not intended to be limited to the specific terms so selected, and is to be understood that each specific term includes all technical equivalence which operate in a similar manner to accomplish a similar purpose.

Figure 1:
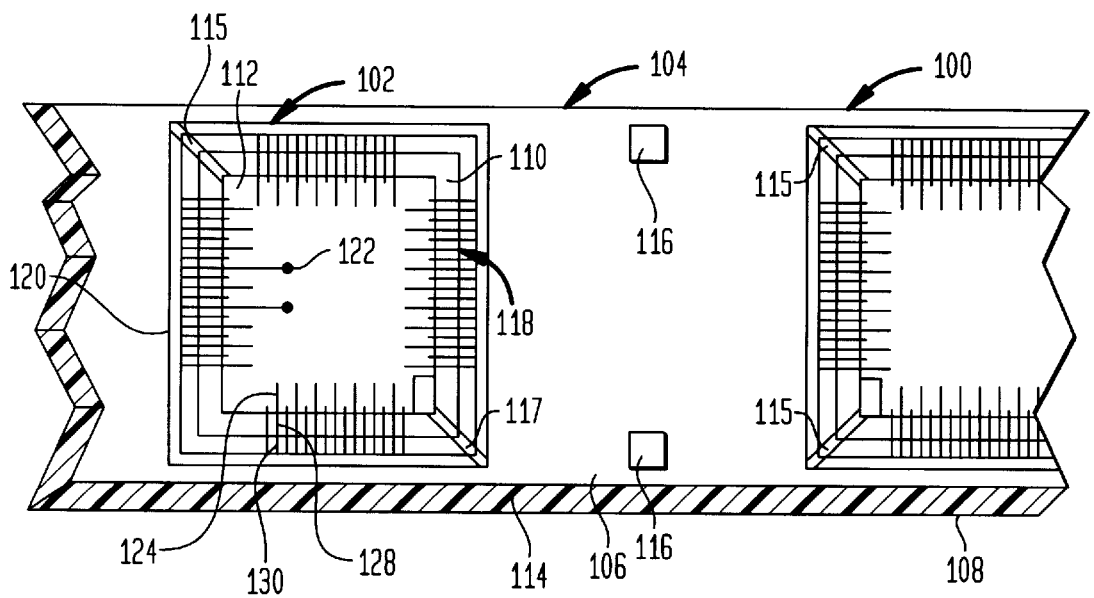
FIG. 1 is a diagrammatic plan view of a microelectronic component incorporating a lead having a frangible intermediate section constructed in accordance with one embodiment of the present invention.
Figure 2:
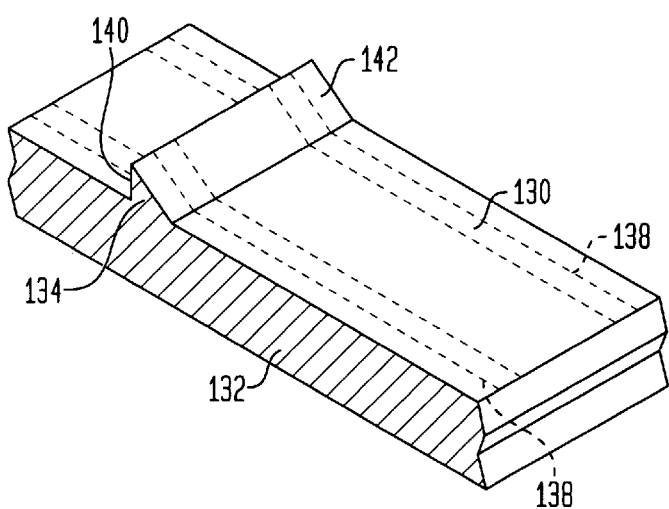
FIGS. 2–7 are diagrammatic sequential illustrations illustrating a method of manufacturing a frangible lead in accordance with one embodiment of the present invention.

Referring now to the drawings, wherein like reference numerals represent like elements, there is shown in FIG. 1 a component in accordance with one embodiment of the invention manufactured from a continuous tape 100. As used herein, microelectronic component broadly refers to semiconductor chips, wafers, connection components, interposers and any other electrical assembly incorporating conductive elements such as leads and/or contacts and which are useful in mounting and connecting electronic devices such as semiconductor devices. The tape 100 includes a plurality of connection components 102 each incorporating a support structure 104. The support structure 104 of each component 102 is in the nature of a flexible, sheet-like dielectric layer 106, for example, a sheet of polyimide material. The support structure 104 also may include a compliant layer 108 lying beneath the structure. The compliant layer 108 typically is formed of a low modulus material such as silicone, flexibilized epoxy or gel and the like. In the alternative to a continuous tape 100, the support structure can be in the nature of individual sheets such as in standard flex circuits which are subsequently divided.

The support structure 104 of each component 102 is provided with gaps 110 in the form of elongated slots extending through the support structure from its top surface to its bottom surface. The gaps 110 subdivide the support structure 104 of each component 102 into a central portion 112 and a peripheral portion 114. The central portion 112 may be temporarily joined to the peripheral portion 114 by a plurality of ribs 115. This enables adapting the tape 100 for use in various chip mounting techniques, whereupon the ribs may be ultimately removed. The gaps 110 merge with one another so that the central portion 112 of each component 102 is not connected to the peripheral portion 114 of the support structure 104 by any other portion of the support structure. Rather, as discussed below, the central portion 112 is temporarily connected to the peripheral portion 114 of the support structure 104 by elongated electrically conductive bonding leads 118 extending across the gaps 110. The tape 100 may be provided with features such as sprocket holes 116 to facilitate feeding and movement of the tape in the production processes.

Each component 102 in accordance with this embodiment has a plurality of elongated electrically conductive buses 120 extending on the peripheral portion 114 of the support structure 104 alongside gaps 110 so that one such bus extends alongside of, and substantially co-directionally with, each gap. The buses 120 of each component 102 form a generally rectilinear, hooplike structure encircling the gaps 110 and the central portion 112 of the support structure 104.

Each component 102 further has electrically conductive terminals 122 disposed on the central portion 112 of the support structure 104 and a plurality of bonding leads 118 extending outwardly from the terminals. Each lead 118 includes a first connection section 124 on the central portion 112 connected to the terminals 122 and extending outwardly across one of the gaps 110, a frangible intermediate section 128 joined to the end of the first connection section and to the end of a second connection section 130 joining the frangible intermediate section to the bus 120 lying alongside of the gaps. The connection section 130 may also be referred to as an end securement section. In addition, that portion of the connection section 124 overlying the support structure 104 can also be referred to as an end securement section The connection sections 124, 130 lie in spaced apart generally parallel planes integrally connected within the gaps 110 to the frangible intermediate section 128.

The frangible intermediate sections 128 generally lie just inside the outer margins of gaps 110. The connection sections 124, 130 of all of the leads 118 associated with any given gap 110 extend generally perpendicular to the gap and generally side-by-side parallel to one another. In the embodiment illustrated, the connection sections 124, 130 and frangible intermediate sections 128 of the leads 118 bridge the gaps 110 and physically connect the central portion 112 of the support structure 104 with the peripheral portion 114 of the support structure.

The connection components 102 as illustrated in FIG. 1 can be made by a process as schematically illustrated in FIGS. 2–9. In accordance with one embodiment of the present invention, a sacrificial metal layer 132, for example, an aluminum layer, is formed with an upwardly directed projection 134. The projection 134 will generally be formed as a continuous body on the upper surface 136 of the sacrificial metal layer 132. As shown, the projection 134 extends transverse to the longitudinal axis of the location where the leads 118 are to be formed as generally indicated by the dashed lines 138. Thus, the projection 134 can simultaneously extend across a plurality of lead forming locations. However, it is contemplated that the projection 138 may be formed in the nature of a plurality of spaced apart colinear segments, each segment arranged transverse to the location of a lead. In either event, the projection 138 is located at the location where it is desired to form the frangible intermediate section 128 of each lead 118.

The projection 134 can be formed on the upper surface 136 of the sacrificial metal layer 132 using conventional semiconductor processing, such as using a photographically patterned resist to permit etching of the sacrificial metal layer 132 to form the projection 134. The projection 134 can also be formed by mechanically removing an upper portion of the sacrificial metal layer 132 such as by grinding, ablation, and the like. Alternatively, the projection 134 can be deposited separately onto the upper surface 136 of the sacrificial metal layer 132 by additive electroplating or chemical vapor deposition using a photographically patterned resist with open areas corresponding to the projection.

The projection 134 has been shown as having a generally triangular cross-sectional shape. For example, the projection 134 is shown having a vertical wall 140 arranged at a 90° angle to the upper surface 136 and a sloped wall 142. The height of the projection 134 above the upper surface 136 may be in the range of about 30% to 50% of the ultimate thickness of the leads 118. By virtue of the triangular shape of the projection 134, a sharp bend is formed at the apex between walls 140, 142 to facilitate the frangibility of the leads as to be described. However, it is to be understood that other shapes for the projection 134 may be provided. For example, the projection 134 may have a cross-sectional shape of rectangular, square, trapezoidal, rounded, irregular and the like.

Figure 3:
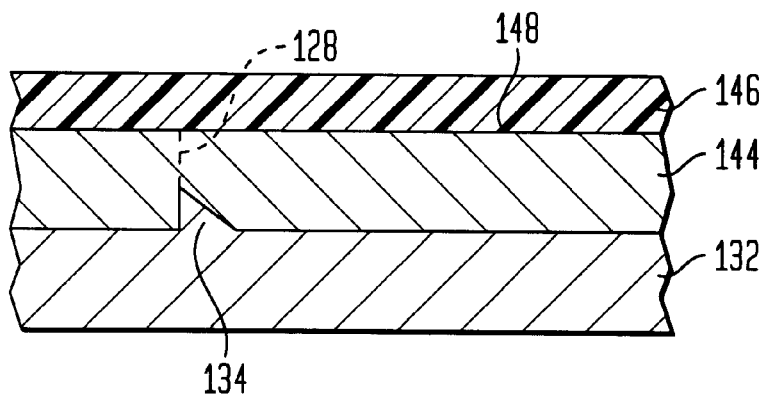

A layer 144 of lead forming material such as gold, copper or gold-copper composite is deposited over the upper surface 136 of the sacrificial metal layer 132 and the projection 134 as shown in FIG. 3. The thickness of the lead forming layer 144 is greater than the height of the projection 134. For example, the thickness of the lead forming layer 144 may be in the range of about 10 to 30 microns. The reduced thickness of the lead forming layer 144 directly over the projection 134 will ultimately form the frangible intermediate section 128.

In depositing the lead forming layer 144 onto the sacrificial metal layer 132, it is contemplated that the deposited layer can be used to form all the leads simultaneously. The lead forming layer 144 can be subsequently subdivided into the individual separate leads 118 using a photographically patterned photomask and etching process. However, it is also contemplated that the individual leads 118 can be formed by depositing lead forming material through a photographically patterned photomask onto the surface of the sacrificial metal layer 132. The leads 118 may be subdivided before or after bonding to the dielectric layer 106.

Figure 4:
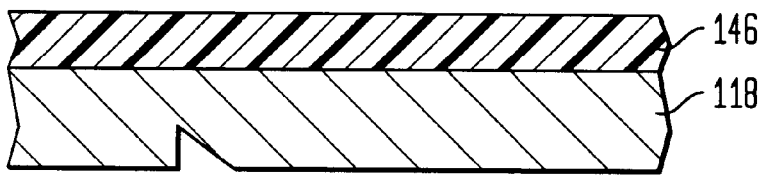
Figure 5:
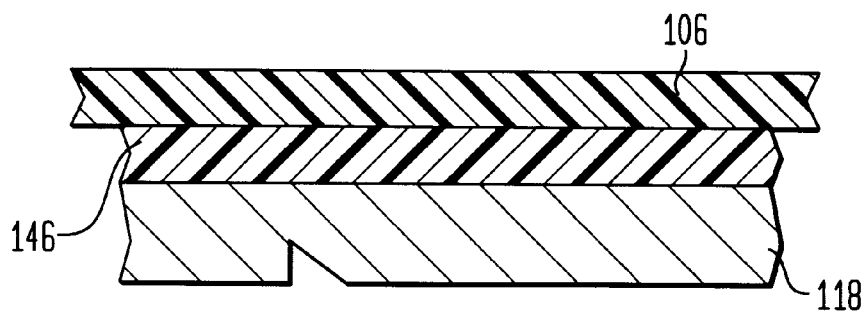

A dielectric layer 146 is deposited onto the exposed surface 148 of the lead forming material 144. The dielectric layer 146 may be deposited as a liquid layer of, for example, polyimide using a spin coat technique. The dielectric layer 146 can also be in the form of an adhesive material, either flexible or rigid, which may be laminated onto the exposed surface 148 of the lead forming layer 144. The dielectric layer 146 forms a support for the leads 118 after the sacrificial metal layer 132 is removed as shown in FIG. 4. In this regard, the sacrificial metal layer 132 may be removed by chemical or plasma etching, or other suitable removal technique such as ablation and the like.

The resulting laminate structure, with or without the leads 118 subdivided, can be adhered to the surface of the flexible, sheet-like dielectric layer 106 in forming the connection component. Where the dielectric layer 146 is in the nature of an adhesive, the adhesive will bond the composite structure to the dielectric layer 106. It is contemplated that a separate adhesive layer between the dielectric layers 106, 146 may be used.

Figure 6:
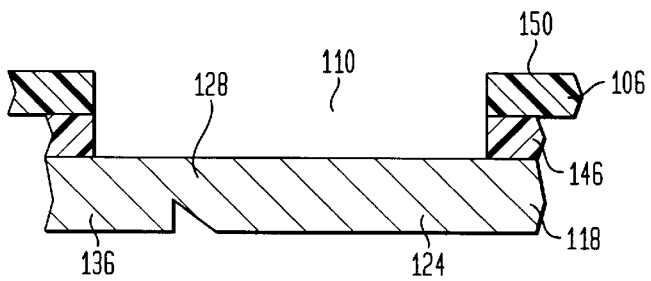

Completion of formation of the leads 118 as shown in FIG. 6, and in particular, freeing the frangible intermediate section 128 and connected first and second connection sections 124, 130 from the dielectric layer 146, is accomplished by masking the bottom surface 150 of the dielectric layer 106 with a mask (not shown). The mask has openings corresponding to the desired locations of the gaps 110 in the dielectric layer 106. Each such opening in the mask is aligned with the connection sections 124, 130 and frangible intermediate sections 128. The structure is then subjected to ablation by radiant energy directed through the opening, or to chemical or plasma etch processing, thereby forming the gaps 110 in alignment with the connection sections 124, 130 of the leads 118 and in alignment with the frangible intermediate sections 128. The radiant energy applied to provide this ablation typically includes a $CO_2$, excimer, yag or KrF laser operating under conditions which will substantially ablate the dielectric layers 106, 146 such as polyimide material, but which will not substantially affect the material of the leads 118. As shown, the frangible intermediate section 128 lies within the gap 110 integrally connecting the connection sections 124, 130 of the leads 118. The leads 118 may be overplated with a gold layer in the order of about 0.5 to 2 microns as a bonding material.

The process pursuant to the present invention has been described as first removing the sacrificial metal layer 132, followed by removal of portions of the dielectric layers 106, 144 to form the gaps 110. However, it is to be understood that the reverse process is contemplated. In this regard, the gaps 110 will be first formed in the dielectric layers 106, 146, followed by removal of the sacrificial metal layer 132.

Following complete separation of the leads 118, the compliant layer 108 may be applied on the bottom surface of the dielectric layer 106 as shown in FIG. 1. Compliant layer 108 may be applied by lamination or by coating techniques such as stenciling or silk screening. Compliant layer 108 is formed having gaps corresponding to the gaps 110 in the dielectric layer 106.

Figure 7:
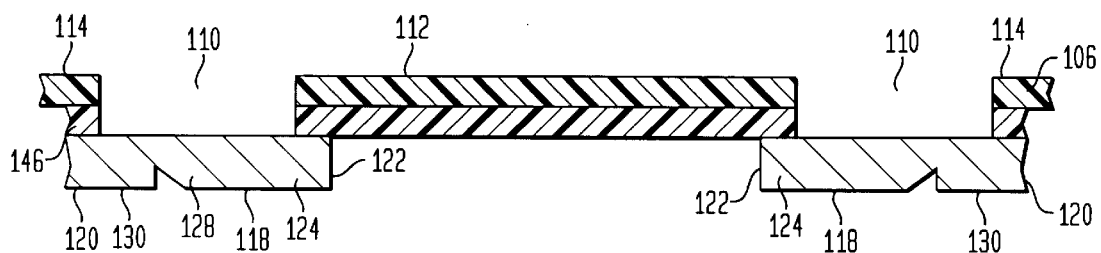

As shown in FIG. 7, gaps 110 are formed in the dielectric layers, 106, 146 so as to separate the central portion 112 from the peripheral portion 114. In this regard, the leads 118 which are disposed over the plural gaps 110 are simultaneously formed as supported on the dielectric layer 146 pursuant to the method as thus far described. Thus, the resulting composite structure will provide a plurality of leads 118 at predetermined locations for forming the connection component 102. It is, however, contemplated that any number of groups of leads 118 and arrangements of such leads may be formed in accordance with the method as thus far described.

Although only a few leads 118 and terminals 122 are illustrated in the drawings, it should be appreciated that a typical component 102 may include hundreds of leads and terminals. Also, although the few terminals 122 illustrated are side-by-side, in practice the terminals are distributed over substantially the entire interior portion 112 of the dielectric layer 106 in a fan out package, or over the peripheral portion 114 in a fan in package or over both in a fan in/fan out package. The portions of the leads 118 which will form the connection sections 124, 130 are disposed in rows. Within each row, all of the leads 118 extend in a lead direction, and adjacent leads 118 are spaced apart from one another in a widthwise direction. The widthwise dimension between each lead 118 desirably is between about 40 microns and about 115 microns depending on the actual width of the leads 118. Whereas, the center-to-center spacing between adjacent leads desirably is about 50 to about 150 microns. The width of each of the leads 118 is preferably about 15–50 microns. Each bus 120 desirably is about 80 to about 200 microns or more wide. The bus 120 and terminals 122 can be formed from the lead forming layer 144 prior to, during or subsequent to the formation of the leads 118 on the dielectric layer 146 using the processes as thus far described. Each connection section 124, 130 is preferably about 30–40 microns long for connection section 124 and about 350–500 microns long for connection section 130. The frangible section 128 will generally be closer to one gap edge than the other to preserve space and maximize the downset lead length. The aforementioned feature sizes can be achieved readily using conventional photoresist deposition, exposure and development techniques and conventional plating techniques.

Figure 8:
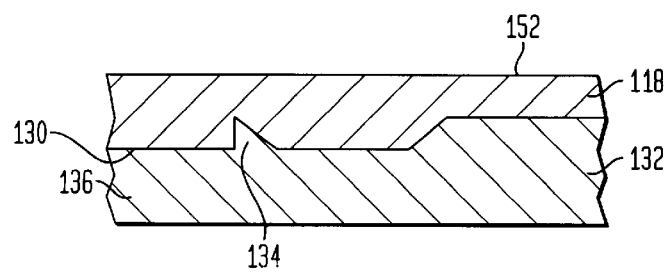
FIGS. 8–9 are diagrammatic sequential illustrations illustrating a method of manufacturing a frangible lead in accordance with another embodiment of the present invention.
Figure 9:
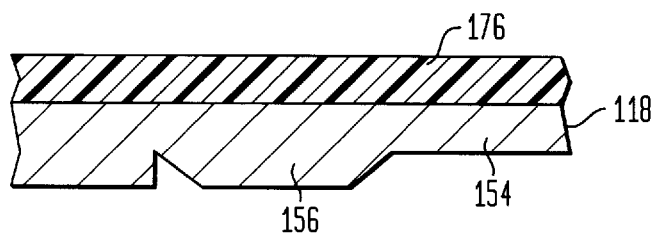

Referring to FIG. 8, the method as thus far described may also be used in profiling the lead so as to provide regions of varying thickness in cross-sectional height. As shown, the sacrificial metal layer 132 is provided with a plateau portion 152 raised above the upper surface 136, in addition to the projection 134. The plateau portion 152 may be profiled to any desired shape in the same manner as in forming projection 134. The resulting lead 118, as shown in FIG. 9, after removal of the sacrificial metal layer 132 has a region 154 thinner in cross-section than an adjacent portion 156. The aforementioned process can therefore be adapted to provide the lead 118 with varying thickness in cross section at any location along the lead 118.

By way of one example, the leads 118 may be formed with a thicker cross-section, wider width or the combination of both in the region adjacent the bonding portion which is commonly referred to as the heel of the bond, i.e., the upwardly curving region close to the contact on the bond side of the lead. The heel region is typically the most fatigue-susceptible region of the lead. By providing the heel as thus described, it is contemplated that lower stresses will be induced in the heel when bent into its curved shape during the bonding process thereby providing the lead with better fatigue resistance.

Figure 10:
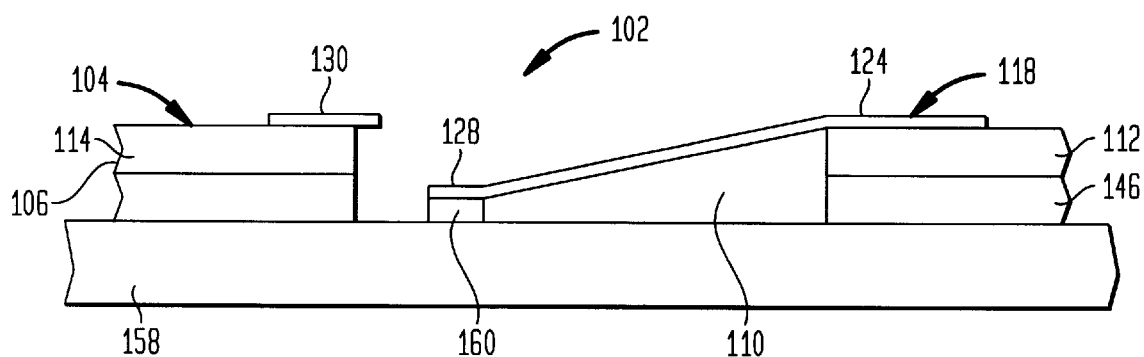
FIG. 10 is a cross-sectional view showing a lead constructed in accordance with the present invention bonded to a contact on a microelectronic component.

The completed connection component 102 can be used by way of one example in the same manner as the connection components described in the '239 Patent and as shown in FIG. 10. Thus, each component may be positioned on a semiconductor chip 158 so that rows of contacts 160 on the chip are aligned with gaps 110 and hence aligned with the various rows of leads 118. During the positioning procedure, the connection sections 124, 130 of each lead 118 are substantially maintained in position on the support structure 104, because both ends of each lead connection section are supported via dielectric layers 146, 106. Thus, each connection section 124, 130 is positioned with respect to the associated contact by positioning of the connection component 102 with respect to the chip 158. Each lead 118 is then engaged by a bonding tool and more precisely aligned with the contact 160 on the chip 158 by the bonding tool.

As the bonding tool moves each lead 118 downwardly toward the contact 160, the frangible intermediate section 128 of the lead 118 breaks, allowing the lead to move freely into engagement with the contact, and the connection section 124 is permanently bonded to the chip contact. The frangible intermediate section 128 is designated to concentrate stress within the lead 118 such as in the area designated by the dashed lines (see FIG. 3) such that it will fracture under tension brittlely at the defined location upon application of normal force thereto by the bonding tool.

The leads 118 of the invention can also be employed in leads which include a polymer layer. Preferably, the polymer layer is absent in the bonding region, or in the part of the bonding region engaged by the bonding tool, to permit efficient energy coupling between the tool and the bond interface. The polymer layer may be provided on either side of the lead 118. Combined metal and polymer lead structures are shown in U.S. Pat. No. 5,489,749, and in U.S. patent application Ser. No. 08/715,571 filed on Sep. 18, 1996, the disclosures of which are incorporated by reference herein.

As thus far described, the leads 118 may extend on either side of a dielectric layer included in a support structure. Thus, the leads 118 depicted in the drawing extend on the top surface of the dielectric layer, remote from the semiconductor chip or other microelectronic element having the contact to which the leads are bonded. However, the leads 118 may extend across the dielectric layer on the bottom surface. Also, the support structure need not include a dielectric layer, but instead may include a metallic lead frame which is used to hold the leads temporarily and which is removed from the leads during or after bonding.

Although the invention herein has been described with reference to particular embodiments, it is to be understood that the embodiments are merely illustrative of the principles and application of the present invention. It is therefore to be understood that numerous modifications may be made to the embodiments and that other arrangements may be devised without departing from the spirit and scope of the present invention as defined by the claims.

What is claimed:

1. A method of making a lead having a frangible intermediate section, said method comprising the steps of providing a sacrificial metal layer, forming a projection on the surface of said sacrificial metal layer from a portion thereof, depositing lead forming material onto the surface of said sacrificial metal layer and over said projection, forming a dielectric layer on the surface of said lead forming material, and removing said sacrificial metal layer whereby said frangible intermediate section is formed within said lead forming material at the location of said projection.

2. The method of claim 1, wherein the height of said projection is less than the thickness of said lead.

3. The method according to claim 1, further including the step of subdividing said lead forming material into individual leads.

4. The method of claim 1, wherein said projection extends transverse to the longitudinal axis of said leads.

5. The method according to claim 1, further including the step of adhering said dielectric layer to a dielectric support layer.

6. The method according to claim 5, further including the step of forming a gap in said dielectric layer and said dielectric support layer at a location opposing said frangible intermediate section.

7. The method of claim 1, wherein the height of said projection is in the range of about 30% to 90% of the thickness of said lead.

8. The method of claim 7, wherein said lead has a thickness in the range of about 10 to 30 microns.

9. The method of claim 1, further including providing a plateau portion on the surface of said sacrificial metal layer.

10. A method of making a microelectronic component comprising the steps of providing at least one lead extending over a gap extending through a vertical extent of a support structure, each said lead including a first connection section extending from the support structure on one side of the gap, a second connection section extending from the support structure on the other side of the gap, and a frangible intermediate section joining said connection sections, said lead formed by providing a sacrificial metal layer, forming a projection on the surface of said sacrificial metal layer from a portion thereof, depositing lead forming material onto the surface of said sacrificial metal layer and over said projection, forming a dielectric layer on the surface of said lead forming material, and removing said sacrificial metal layer whereby said frangible intermediate section is formed within said lead forming material at the location of said projection, said frangible intermediate section and at least a part of said first connection section aligned over said gap so that said first connection section of each lead can be detached from said second connection section by breaking the frangible intermediate section upon being displaced in said gap.

11. The method of claim 10, wherein said step of forming said leads includes the step of subdividing a continuous layer of said lead forming material into said leads.

12. The method of claim 10, wherein the height of said projection is less than the thickness of said lead.

13. The method of claim 10, further including the step of adhering said dielectric layer to a dielectric support layer.

14. The method of claim 13, further including the step of forming a gap in said dielectric layer and said dielectric support layer at a location opposing said frangible intermediate section.

15. The method of claim 10, wherein the height of said projection is in the range of about 30% to 90% of the thickness of said lead.

16. The method of claim 15, wherein said lead has a thickness in the range of about 10 to 30 microns.

17. The method of claim 10, further including providing a plateau portion on the surface of said sacrificial metal layer.

18. The method of claim 10, wherein said microelectronic component comprises a semiconductor chip.

19. The method of claim 10, wherein said microelectronic component comprises a semiconductor wafer.

20. A method of making electrical connection to a microelectronic component having at least one contact, said method comprising juxtaposing a connection component with a microelectronic component, said connection component having a supporting structure and at least one lead made in accordance with the method of claim 1 connected to said supporting structure, said lead including a bond region adjacent said frangible intermediate section adapted to be aligned with said contact, severing said lead at said frangible intermediate section, and bonding said bond region of said lead to said contact on said microelectronic component.

21. The method of claim 20, further including providing a plurality of said leads each having a bond region adjacent a frangible intermediate section and bonding said bond region of each of said leads to a corresponding contact on said microelectronic component.

22. The method of claim 20, further including the step of adhering said dielectric layer to a dielectric support layer.

23. The method of claim 22, further including the step of forming a gap in said dielectric layer and said dielectric support layer at a location opposing said frangible intermediate section.

24. The method of claim 20, wherein the height of said projection is in the range of about 30% to 90% of the thickness of said lead.

25. The method of claim 24, wherein said lead has a thickness in the range of about 10 to 30 microns.

26. The method of claim 20, further including providing a plateau portion on the surface of said sacrificial metal layer.

27. The method of claim 20, wherein said microelectronic component comprises a semiconductor chip.

28. The method of claim 20, wherein said microelectronic component comprises a semiconductor wafer.

29. A method of making a microelectronic assembly comprising electrically connecting a microelectronic component to another microelectronic component, at least one of said microelectronic components made in accordance with the method of claim 10.

30. The method of claim 29, further including the step of adhering said dielectric layer to a dielectric support layer.

31. The method of claim 30, further including the step of forming a gap in said dielectric layer and said dielectric support layer at a location opposing said frangible intermediate section.

32. The method of claim 29, wherein the height of said projection is in the range of about 30% to 90% of the thickness of said lead.

33. The method of claim 32, wherein said lead has a thickness in the range of about 10 to 30 microns.

34. The method of claim 29, further including providing a plateau portion on the surface of said sacrificial metal layer.

35. The method of claim 29, wherein said microelectronic component comprises a semiconductor chip.

36. The method of claim 29, wherein said microelectronic component comprises a semiconductor wafer.

37. The method of claim 1, wherein said sacrificial layer comprises aluminum.

38. The method of claim 10, wherein said sacrificial layer comprises aluminum.

39. The method of claim 20, wherein said sacrificial layer comprises aluminum.

40. The method of claim 29, wherein said sacrificial layer comprises aluminum.

* * * * *